(12) United States Patent
Lukanc et al.

(10) Patent No.: US 8,003,545 B2
(45) Date of Patent: Aug. 23, 2011

(54) METHOD OF FORMING AN ELECTRONIC DEVICE INCLUDING FORMING FEATURES WITHIN A MASK AND A SELECTIVE REMOVAL PROCESS

(75) Inventors: Todd Lukanc, San Jose, CA (US); Hung-Eil Kim, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 691 days.

(21) Appl. No.: 12/031,458

(22) Filed: Feb. 14, 2008

(65) Prior Publication Data

US 2009/0209107 A1 Aug. 20, 2009

(51) Int. Cl.
*H01L 21/302* (2006.01)
(52) U.S. Cl. .......... 438/739; 438/733; 438/700
(58) Field of Classification Search .......... 438/700, 438/733, 739
See application file for complete search history.

(56) References Cited

U.S. PATENT DOCUMENTS

| | | | |
|---|---|---|---|
| 4,179,792 A * | 12/1979 | Marshall et al. | 438/154 |
| 4,711,835 A * | 12/1987 | Dufour | 430/314 |
| 5,057,462 A | 10/1991 | Eisenberg et al. | |
| 5,567,982 A * | 10/1996 | Bartelink | 257/664 |
| 5,690,841 A * | 11/1997 | Elderstig | 216/39 |
| 5,858,591 A | 1/1999 | Lin et al. | |
| 5,900,349 A | 5/1999 | Han | |
| 6,051,866 A * | 4/2000 | Shaw et al. | 257/417 |
| 6,232,202 B1 * | 5/2001 | Hong | 438/424 |
| 6,458,606 B2 | 10/2002 | Plat et al. | |
| 6,753,266 B1 | 6/2004 | Lukanc et al. | |
| 7,015,148 B1 | 3/2006 | Lukanc et al. | |
| 7,202,148 B2 | 4/2007 | Chen et al. | |
| 7,234,129 B2 | 6/2007 | Beale et al. | |
| 2004/0194799 A1 * | 10/2004 | Kim et al. | 134/1.3 |
| 2007/0141476 A1 | 6/2007 | Flanagin et al. | |

* cited by examiner

*Primary Examiner* — A. Sefer
*Assistant Examiner* — Allen L Parker

(57) ABSTRACT

A method of forming an electronic device can include forming a patterned mask layer overlying a underlying layer such that the mask layer has a first feature, a second feature, and a third feature, and the first feature is between the second feature and the third feature. The first feature can be spaced apart from the second feature by a first opening in the mask layer, and can be spaced apart from the third feature by a second opening in the mask layer. The method can further include selectively removing portions of the underlying layer under the first opening, the second opening, the second feature, and the third feature, and also removing the second feature and the third feature while leaving substantially all of the first feature and a significant portion of the underlying layer under the first feature.

20 Claims, 3 Drawing Sheets

METHOD OF FORMING AN ELECTRONIC DEVICE INCLUDING FORMING FEATURES WITHIN A MASK AND A SELECTIVE REMOVAL PROCESS

BACKGROUND

1. Field of the Disclosure

The following application is directed to a method of forming an electronic device, and particularly directed to selectively removing portions of layers on a workpiece to form an electronic device.

2. Description of the Related Art

Typically, when attempting to form features in an underlying layer, one common method of completing such a process is etching. While various types of etching processes exist, including for example reactive ion etching (RIE) or plasma etching, each of the processes have problems, one of which is etch proximity effects. In general, etch proximity effects result in differences between what is intended to be formed and the actual feature that is formed and can be attributed to the density of the features being etched per unit area. As such, etch proximity effects can result in less cross-sectional symmetry of the features being formed, such that one side of an etched feature is significantly different than another side. Such results can lead to differences in electronic performance of the component being formed. Moreover, etch proximity effects can manifest themselves in differences between isolated features and nested features (i.e., low density versus high density of features). Accordingly, as the dimensions of electronic components continues to shrink, etch proximity effects will continue to become a greater concern.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

In an exemplary, non-limiting embodiment, a method of forming an electronic device is disclosed which can include forming a patterned mask over an underlying layer, wherein the patterned mask includes a first feature, second feature, and a third feature, and the first feature is spaced apart from the second feature by a first opening in the mask layer, and is spaced apart from the third feature by a second opening in the mask layer. The method can also include selectively removing the underlying layer under the second feature and third feature, and also removing the second feature and third feature, while retaining the first feature and a significant portion of the underlying layer under the first feature. Such a process can facilitate precise formation of features within the underlying layer while lessening the etch proximity effects to the portion of the etched layer underlying the first feature.

Figure 1:
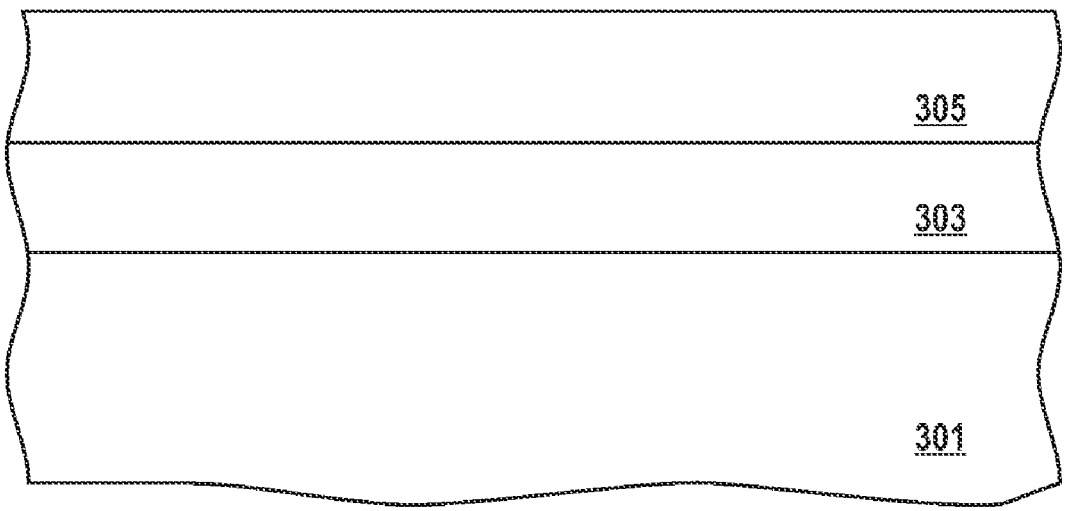
FIG. 1 includes a cross-sectional illustration of a portion of a workpiece including a substrate, a layer overlying the substrate, and a mask layer overlying the layer in accordance with an embodiment.

Attention is now directed to particular embodiments of forming an electronic device through processes illustrated in FIGS. 1-6. FIG. 1 includes a cross-sectional illustration of a portion of a workpiece including a substrate 301, a layer 303 overlying the substrate 301, and a mask layer 305 overlying the layer 303. The substrate 301 can include a semiconductor material or insulative material, or any combination thereof. For example, the workpiece can include a monocrystalline semiconductor wafer, semiconductor-on-insulator (SOI) wafer, a flat panel display (e.g., a silicon layer over a glass plate), or other substrates conventionally used to form electronic devices. The substrate 301 can include a dopant, such as including a n-type or p-type dopant. Moreover, the substrate 301 can include electronic components or portions of electronic components previously formed thereon, including for example, implant regions, field isolation regions, or other layers used to form electronic components such as transistors.

Layer 303 overlies the substrate 301 and can include a semiconductor material or insulative material, or any combination thereof. In a particular embodiment, layer 303 includes polysilicon. In a more particular embodiment, layer 303 includes doped polysilicon, or another material suitable for forming gate electrodes. Layer 303 generally can have a thickness of less than approximately 1000 nm. In another embodiment, the average thickness of layer 303 is less than approximately 800 nm, such as less than approximately 600 nm. Still, in accordance with another embodiment, the thickness of layer 303 is at least approximately 10 nm. For example, in other embodiments, the thickness of layer 303 can be greater, such that it is at least approximately 50 nm, or even approximately 80 nm. In a particular embodiment, the thickness of layer 303 is within a range between approximately 10 nm and approximately 600 nm, and more particularly, within a range between approximately 80 nm and approximately 200 nm. Layer 303 can be formed by a conventional or proprietary technique.

Before patterning, the mask layer 305 can include a conformal layer of material that overlies layer 303. In a particular embodiment, the mask layer 305 can include a resist material, which can include an organic material commonly used in a photolithography process. As such, in accordance with an embodiment, the mask layer 305 includes a resin. Alternatively, the mask layer 305 can include a hard mask material, including for example a nitride material. The mask layer 305 can be formed by a conventional or proprietary technique.

Figure 2:
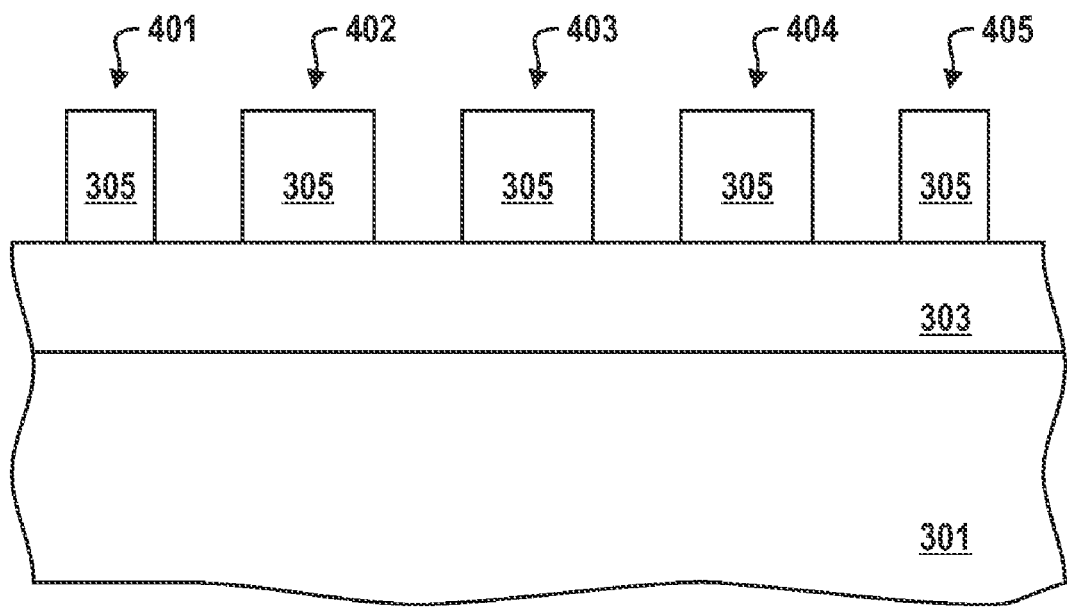
FIG. 2 includes a cross-sectional illustration of the workpiece of FIG. 1 after patterning the mask layer to form patterned portions of the mask layer in accordance with an embodiment.
Figure 3:
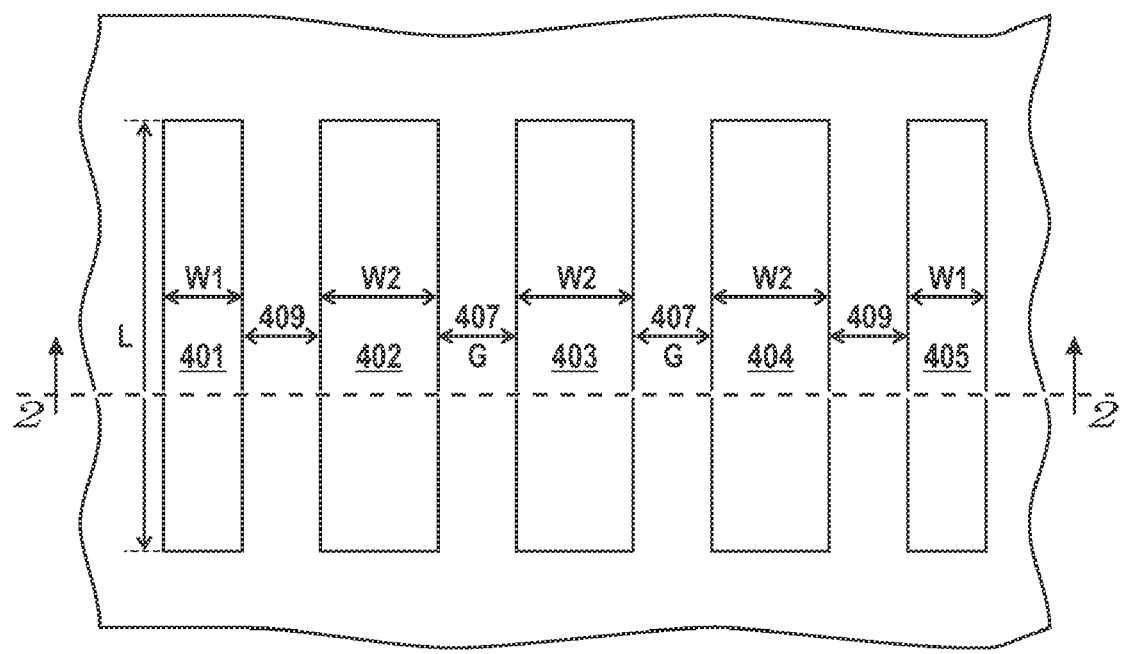
FIG. 3 includes a top view of a portion of the workpiece of FIG. 2 including a substrate and patterned portions of the mask layer overlying the substrate and the layer overlying the substrate in accordance with an embodiment.

FIG. 2 includes a cross-sectional illustration of the workpiece of FIG. 3 after patterning the mask layer 305 to form patterned portions. After selectively removing portions of the mask layer 305, patterned portions 401, 402, 403, 404, and 405 (401-405) remain overlying the layer 303 which will help in forming features within the layer 303. In accordance with an embodiment, patterning includes selectively exposing portions of the mask layer 305 to radiation, and subsequently removing select portions of the mask layer 305 to form the patterned portions 401-405. In another embodiment, the patterned portions 401 and 405 have a different size as compared to patterned portions 402, 403, and 404. In still another embodiment, each of the patterned portions 401-405 are laterally spaced apart from each other and separated by openings in the mask layer 305. The particulars regarding the different size of the pattern portions 401 and 405 as well as particulars regarding the distance between the patterned portions 401-405 are described herein in accordance with the embodiment of FIG. 3.

FIG. 3 includes a top view of a portion of the workpiece of FIG. 2 including the substrate, the layer overlying the substrate, and overlying patterned portions 401-405 in accordance with an embodiment. In particular, FIG. 3 includes a sectioning line 2-2 representing the line through the workpiece in which the cross-sectional view of FIG. 2 is presented. As illustrated, the patterned portions 401-405 are the same as those previously described in accordance with FIG. 2, such that the patterned portions 401-405 are portions of the mask layer 305. In accordance with a particular embodiment, pattern portions 401 and 405 can be completely removed during a selective etching process while pattern portions 402, 403 and 404 remain after completion of the selective etching process.

As illustrated, the patterned portions 402, 403, and 404 are separated by a gap distance 407. In an embodiment, the gap distance 407 is not greater than approximately 200 nm. In accordance with another embodiment, the gap distance 407 is less, such as not greater than approximately 150 nm, or not greater than approximately 100 nm, or even not greater than approximately 90 nm. Still, in another embodiment, the gap distance 407 is at least approximately 10 nm, such as at least approximately 20 nm, or at least approximately 25 nm. In a particular embodiment, the gap distance 407 is within a range between approximately 25 nm and approximately 150 nm, and more particularly, within a range between approximately 30 nm and approximately 100 nm.

While the patterned portions 402-404 are separated by a gap distance 407, which is substantially uniform, the patterned portions 401 and 405 may be spaced apart from the other patterned portions 402-404 by a lateral distance 409 that is different than the gap distance 407. In accordance with an embodiment, the lateral distance 409 is less than the gap distance 407. As such, in a particular embodiment, the lateral distance 409 is at least approximately 70% of the gap distance 407. In another embodiment, the lateral distance 809 is at least approximately 75%, such as at least approximately 80%, or even at least approximately 90% of the gap distance 407. Still, in a particular embodiment, the lateral distance 409 can be substantially the same as the gap distance 409.

Still, in accordance with other embodiments, the lateral distance 409 can be greater than the gap distance 407. In a particular embodiment, the lateral distance 409 can be greater than the gap distance 407 by at least approximately 5% of the gap distance 407. In another embodiment, the lateral distance 409 is greater than the gap distance 407 by at least approximately 10% of the gap distance 407, such as at least approximately 20% of the gap distance 407, or even at least approximately 30% of the gap distance 407. Typically, however, the lateral distance 409 is not more than 60% greater than the gap distance 407. Still, according to one particular embodiment, the lateral distance 409 is within a range between about 100% and 160% of the gap distance 407, and more particularly within a range between about 110% and about 140% of the gap distance 407.

The patterned portions 401-405 have dimensions of length, width, and thickness, and as illustrated in FIG. 3, each of the patterned portions 401 and 405 can be significantly smaller than any one of the patterned portions 402-404 as measured by the area of the top of the patterned portions (i.e., average length (L)×average width (W)). In a particular embodiment, each of the patterned portions 401 and 405 are at least approximately 5% smaller than one of the patterned portions 402-404. In another embodiment, each of the patterned portions 401 and 405 are at least approximately 10% smaller, such as at least approximately 15% smaller, or at least approximately 20% smaller than one of the patterned portions 402-404. In still another embodiment, each of the patterned portions 401 and 405 are not more than approximately 40% smaller than one of the pattern portions 402-404.

In accordance with another embodiment, the patterned portions 401 and 405 can be larger, as measured by the area, than the patterned portions 402-404. As such, in one embodiment, the patterned portions 401 and 405 are at least approximately 5% larger than the patterned portions 402-404. In another embodiment, the patterned portions 401 and 405 have an area that is at least approximately 10%, such as at least approximately 15% or even at least approximately 20% larger than the patterned portions 402-404. In a particular embodiment, each of the patterned portions 401 and 405 are within a range between approximately 80% and approximately 120%, and more particularly between approximately 90% and approximately 110% of the size of the patterned portions 402-404.

Generally, each of the patterned portions 401 and 405 can have a width (W1) that is significantly less than the width (W2) of any one of the patterned portions 402-404. In a particular embodiment, each of the patterned portions 401 and 405 have a width (W1) that is not greater than approximately 90% of the width (W2) of one of the patterned portions 402-404. In another embodiment, the width (W1) of each of the pattern portions 401 and 405 is less, such as not greater than approximately 80%, such as not greater than approximately 70% of the width (W2) of any one of the patterned portions 402-404. Still, in accordance with other embodiments, each of the portions 401 and 405 have a width (W1) of at least approximately 10% of the width (W2) of any one of the patterned portions 402-404. In another embodiment, each of the patterned portions 401 and 405 have a width (W1) within a range between approximately 25% and approximately 70% of the width (W2) of any one of the patterned portions 402-404, and more particularly within a range between approximately 30% and approximately 65% of the width (W2) of any one of the patterned portions 402-404.

In particular reference to values of width, generally the width (W2) of any of the patterned portions 402-404 is not greater than approximately 200 nm. In a particular embodiment, the width (W2) of the patterned portions 402-404 is not greater than approximately 150 nm, such as not greater than approximately 125 nm, or not greater than approximately 100 nm. Still, the width (W2) of the patterned portions 402-404 is generally at least approximately 10 nm, such as at least approximately 15 nm, or even at least approximately 20 nm. In another particular embodiment, the width (W2) of the patterned portions 402-404 is within a range between approximately 20 nm and approximately 100 nm.

Each of the patterned portions 401 and 405 can have a length (L) that is substantially the same as the length of any one of the patterned portions 402-404. Still, in accordance with one embodiment, the patterned portions 401 and 405 can have a length that is less than the length of the patterned portions 402-404. As such, in one particular embodiment, the length of the patterned portions 401 and 405 is at least approximately 5% less, such as at least about 10% less than the length of the patterned portions 402-404. Generally, the length of the patterned portions 401 and 405 is not greater than approximately 20% less than the length of the patterned portions 402-404.

In still another embodiment, the length of each of the patterned portions 401 and 405 is greater than any one of patterned portions 402-404. As such, in another embodiment, each of the patterned portions 401 and 405 can have a length that is at least approximately 5% greater than the length of any of the patterned portions 402-404. In another particular embodiment, the length of patterned portions 401 and 405 can have a length that is approximately 10% greater, such as at least approximately 15% greater or even at least approximately 20% greater than the length of one of the patterned portions 402-404. Generally, the length of each of the patterned portions 402 and 405 can be within a range between approximately 5% less and approximately 50% greater, and more particularly within a range between 5% less and approximately 15% greater than the length of any one of the patterned portions 402-404.

Generally, the lengths of the patterned portions can vary depending upon the feature being formed in the underlying layer. In particular reference to embodiments using the patterned portions to form word lines or bit lines as part of a memory array, the lengths of the patterned portions 402-404 is typically commensurate with the length of the features formed in the underlying layer and accordingly can be at least approximately 50 nm. In a particular embodiment, the lengths of the patterned portions 402-404 is at least approximately 100 nm. Generally, the lengths of the patterned portions 402-404 are not greater than approximately 1 mm. As such, in a particular embodiment, the lengths are less, such as not greater than approximately 500 microns, such as not greater than approximately 250 microns, or even not greater than approximately 100 microns. In accordance with one particular embodiment, the lengths of the patterned portions 402-404 are within a range between 100 nm and 100 microns.

While it has been illustrated that the patterned portions 401 and 405 can have substantially the same dimensions, in accordance with an embodiment, each of the patterned portions 401 and 405 may have different lengths, widths, or thicknesses as compared to the other portion. As such, in an embodiment, each of the patterned portions 401 and 405 have a length, width, and thickness, that does not differ by greater than approximately 20%, and more particularly not greater than approximately 10% as compared to a corresponding dimension of a corresponding patterned portion (i.e., 401 or 405). Still, in most embodiments, it is suitable to form patterned portions 401 and 405 that have substantially the same dimensions.

Figure 4:
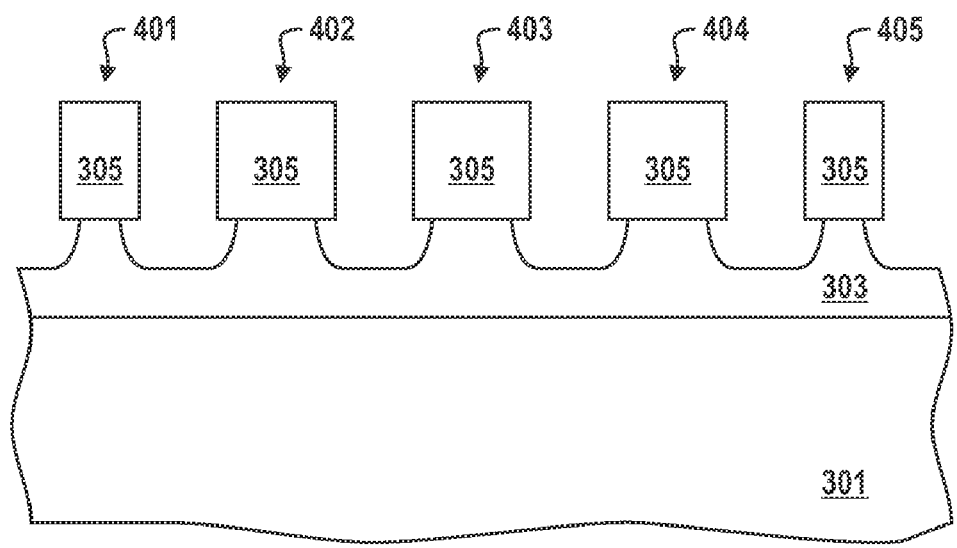
FIG. 4 includes a cross-sectional illustration of the workpiece of FIG. 2 during a selective etching process in accordance with an embodiment.

FIG. 4 includes a cross-sectional illustration of a portion of the workpiece of FIG. 2 during a selective etching process. As illustrated, during the selective etching process, portions of layer 303 are removed. In particular, during the selective etching process, those portions of layer 303 underlying the openings between the patterned portions 401-405 are etched at a greater rate than those portions of layer 303 directly underlying portions 401-405.

Figure 5:
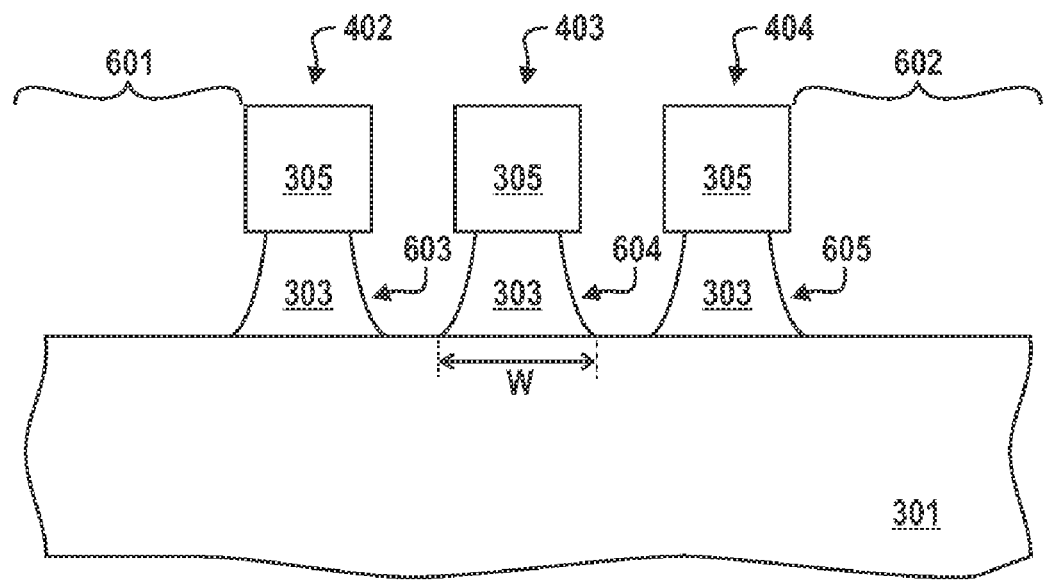
FIG. 5 includes a cross-sectional illustration of the workpiece of FIG. 4 after completing the selective etching process in accordance with an embodiment.

FIG. 5 includes a cross-sectional illustration of the workpiece of FIG. 4 after completing the selective etching process. After completing the selective etching process, portions of the layer 303 are completely removed. In particular, portions of the layer 303 within regions 601 and 602, as well as patterned portions (i.e., 401 and 405 in FIG. 4) of the mask layer 305 that were present within regions 601 and 602 are completely removed. Notably, while the pattern portions 401 and 405 are completely removed during the selective etching process, the patterned portions 402-404 remain after completing the process. The features 603-605 underlying the patterned portions 402-404 are remaining portions of layer 303 that can be permanent features forming electronic components. In a particular embodiment, the feature 603-605 are word lines of a memory array. In another particular embodiment, a significant portion of the layer 303 within the features 603-605 under the patterned portions 402-404 comprises a full thickness of the original underlying layer 303. In a more particular embodiment, the remaining features 603, 604, and 605 (603-605) each have a width (W) that extends laterally across a majority of the width of the patterned portions 402-404.

In reference to the process of selectively removing portions of the layer 303 as well as patterned portions 401 and 405, the selective removal process can include a particular selective etching process. In accordance with an embodiment, the selective etching process can include completing a first portion of a selective etching process using a first etchant, and completing a second portion of the selective etching process using a second etchant. In a particular embodiment, the first etchant can include a combination of the chemicals notably including a hydrogen-containing material, wherein by comparison, the second etchant comprises significantly less of the hydrogen-containing material than the first etchant.

In particular reference to the composition of the first etchant, in a particular embodiment, the first etchant can include HBr, $CCl_4$, $CF_4$, $CHF_3$, or any combination thereof. As described, in an embodiment, the first etchant composition can include a greater amount of a hydrogen-containing material than the second etchant composition. The hydrogen can be provided alone, such as in elemental or molecular form, however oftentimes, the hydrogen is combined with other elements to form a composition. As such, in a particular embodiment, the first etchant composition includes at least approximately 5% greater hydrogen on an atomic basis than the second etchant composition. In another embodiment, the first etchant composition includes at least approximately 10% greater hydrogen, or even at least approximately 15% greater hydrogen content than the second etchant composition. In another embodiment, the first etchant composition has a hydrogen content greater than the hydrogen content of the second etchant composition within a range between approximately 5% and approximately 50%, and more particularly within a range between approximately 10% and approximately 30%.

In reference to completing the second portion of the selective etching process, the second etchant composition can include HBr, $CCl_4$, $CF_4$, $CHF_3$, $O_2$, or any combination thereof. In accordance with an embodiment, the second etchant composition can include a combination of etching chemicals, one of which is an oxygen-containing material. The oxygen-containing material can be provided alone (e.g., in elemental or molecular form) or in combination with (i.e., part of a chemical compound) other compositions. In a particular embodiment, the second etchant composition includes a greater amount of oxygen than the first etchant. In another embodiment, the second etchant composition includes an oxygen-containing material that is present in a greater amount, on an atomic basis, than is present within the first etchant composition. In accordance with a particular embodiment, the second etchant composition includes at least approximately 5% greater oxygen than the first etchant composition. Still, in another embodiment, the second etchant composition comprises at least approximately 10%, such as at least approximately 15%, or even at least approximately 20% greater oxygen than the first etchant composition. In another embodiment, the second etchant composition has an oxygen content greater than the oxygen content of the first etchant composition within a range between approximately 5% and approximately 50%, and more particularly within a range between approximately 10% and approximately 30%.

The use of a first etchant composition followed by the use of a second, different etchant composition facilitates changing the bias, or increasing the undercutting of the etching procedure, thus, changing the selectivity of the materials etched. Accordingly, such a process facilitates selective removal of portions of the underlying layer as well as selective removal of certain patterned portions (e.g., 401 and 405).

Figure 6:
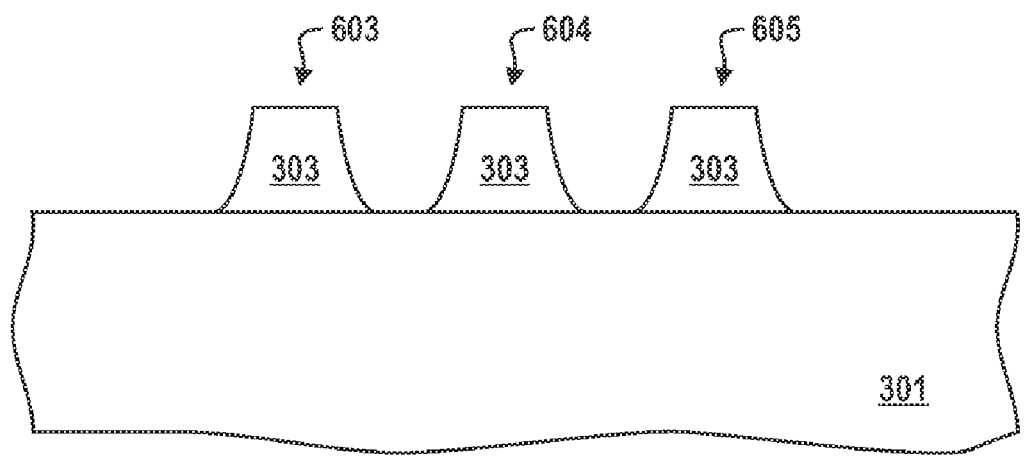
FIG. 6 includes a cross-sectional illustration of the workpiece of FIG. 5 after removing the remaining patterned portions of the mask layer in accordance with an embodiment.

FIG. 6 includes a cross-sectional illustration of the workpiece of FIG. 5 after removing the remaining patterned portions of the mask layer. In accordance with an embodiment, after completing the selective etching process and forming the features 603-605, the remaining patterned portions of the mask layer overlying the features 603-605 can be removed. In another embodiment, such a process can include an ashing process which is particularly useful when the mask layer portions are a resist layer. As illustrated, the features 603-605 are formed through an etching process that can lessen the impact of etch proximity effects. In particular, features 603-605 have substantially uniform size and shape availing them to uniform electronic performance.

When etching, etch proximity effects can cause undesirable changes in dimensions of etch features, leading to deviations in the performance of an electrical component from its original design criteria. Etch proximity effects can have a greater influence on those features which are near the resolution limits of the equipment, such as photolithography equipment. As technology continues to shrink, etch proximity effects will continue to be a greater obstacle, and a greater portion of the processing budget. In accordance with embodiments herein, a method of forming an electronic device is provided that includes forming a mask layer having portions over an underlying layer and using a selective etch process wherein some of the portions are completely removed while other portions remain to form features in the underlying layer, wherein the impact of etch proximity effects are lessened. Such a process is suitable for forming electronic components including diodes, transistors, and memory arrays. Such electronic components can be part of various electronic devices including for example integrated circuits, which in turn can be components within computers, displays, phones, and the like.

In accordance with a first aspect, a method of forming an electronic device can include forming a patterned mask layer overlying a underlying layer and having a first feature, a second feature, and a third feature, such that the first feature is between the second feature and the third feature, and the first feature is spaced apart from the second feature by a first opening in the mask layer, and is spaced apart from the third feature by a second opening in the mask layer. The first aspect can further include selectively removing portions of the underlying layer under the first opening, the second opening, the second feature, and the third feature, and also removing the second feature and the third feature while leaving substantially all of the first feature and a significant portion of the underlying layer under the first feature. In an embodiment of the first aspect, the method of forming the patterned mask layer includes forming a resist material over the underlying layer, selectively exposing portions of the resist material to radiation, and removing portions of the resist material to form the patterned mask layer. In another embodiment of the first aspect, the method further includes completely removing the first feature after selectively removing portions of the underlying layer.

In accordance with another embodiment of the first aspect, the significant portion of the underlying layer under the first feature includes a full thickness of the underlying layer having a width extending laterally across a majority of the width of the first feature. Still, in another embodiment, the underlying layer comprises doped polysilicon. In still another embodiment, the process of selectively removing portions comprises forming word lines or bit lines of a memory array.

In another embodiment of the first aspect, the first feature includes an array of features laterally spaced apart and separated by openings in the mask layer by a gap distance. In a more particular embodiment, the gap distance is not greater than approximately 100 nm. In still another particular embodiment, the first feature and the second feature are spaced apart by a first lateral distance, and the first feature and the third feature are spaced apart by a second lateral distance, wherein the first lateral distance and the second lateral distance are the same. As such, in a more particular embodiment of the first aspect, the first lateral distance and the second lateral distance are greater than the gap distance. In another particular embodiment, the first lateral distance and the second lateral distance are at least approximately 80% of the gap distance.

In accordance with an embodiment of the first aspect, the second feature and the third feature are significantly smaller than the first feature. In a particular embodiment, the first feature, second feature, and third feature comprise dimensions of length, width, and thickness, and wherein the second feature and the third feature have a width significantly less than the width of the first feature. In another particular embodiment, the width of the second feature and the third feature is not greater than approximately 90% of the width of the first feature. Still, in another embodiment, the length of the second feature and the third feature is substantially the same as the length of the first feature.

In another embodiment of the first aspect, the process of selectively removing particularly includes the steps of completing a first portion of a selective etching process using a first etchant, and completing a second portion of a selective etching process using a second etchant, the second etchant comprising an oxygen-containing material in a greater amount than present in the first etchant. In a particular embodiment, the first etchant comprises a hydrogen-containing material, and the second etchant comprises significantly less hydrogen-containing materials than the first etchant. In a more particular embodiment, the first etchant comprises HBr, $CCl_4$, $CF_4$, $CHF_3$, or a combination thereof.

In accordance with a second aspect, a method of forming an electronic device can include forming a patterned resist layer overlying a polysilicon layer, the patterned resist layer having a first feature, a second feature, and a third feature. Additionally, the first feature can be between the second feature and the third feature, such that the first feature is spaced apart from the second feature by a first opening in the resist layer, and is spaced apart from the third feature by a second opening in the resist layer. Moreover, the first feature, second feature, and third feature can have widths, and the width of the second feature and the third feature can be less than the width of the first feature. The method can further include selectively etching all of the polysilicon layer under the first opening, the second opening, the second feature, and the third feature using a first etchant comprising a hydrogen-containing material, and then completely removing the second feature and the third feature using a second etchant comprising an oxygen-containing material and less hydrogen-containing material than the first etchant. In particular, the second aspect further includes, after selectively etching, the first feature remains and a significant portion of the polysilicon layer having a full thickness of the polysilicon layer underlying the first feature remains.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method of forming an electronic device comprising:
   forming a mask layer over an underlying layer;
   patterning the mask layer to form
      a first feature,
      a second feature, and
      a third feature
      having substantially the same composition,
   wherein the first feature is between the second feature and the third feature,
   wherein the first feature
      is spaced apart from the second feature by a first opening in the mask layer and
      is spaced apart from the third feature by a second opening in the mask layer;
   selectively removing portions of the underlying layer under
      the first opening,
      the second opening,
      the second feature, and
      the third feature; and
   removing, by etching, substantially all of the second feature and substantially all of the third feature while leaving substantially all of the first feature and a significant portion of the underlying layer under the first feature.

2. The method of claim 1, wherein forming the patterned mask layer comprises:
   forming a resist material over the underlying layer;
   selectively exposing portions of the resist material to radiation; and
   removing portions of the resist material to form the patterned mask layer.

3. The method of claim 1, wherein the significant portion of the underlying layer under the first feature comprises a full thickness of the underlying layer having a width extending laterally across a majority of the width of the first feature after selectively removing portions.

4. The method of claim 1, wherein the underlying layer comprises doped polysilicon.

5. The method of claim 1, wherein selectively removing portions comprises forming word lines of a memory array.

6. The method of claim 1, wherein selectively removing portions comprises forming bit lines of a memory array.

7. The method of claim 1, wherein the first feature comprises an array of discrete patterned portions laterally spaced apart and separated from each other by openings in the mask layer, the lateral distance between each of the discrete patterned portions defines a gap distance.

8. The method of claim 1, wherein the second feature is spaced apart from an immediately adjacent discrete patterned portion of the first feature by a first lateral distance, and wherein the third feature is spaced apart from an immediately adjacent discrete patterned portion of the first feature by a second lateral distance, wherein the first lateral distance and the second lateral distance are the same.

9. The method of claim 8, wherein the first lateral distance and the second lateral distance are greater than the gap distance.

10. The method of claim 8, wherein the first lateral distance and the second lateral distance are at least approximately 70% of the gap distance.

11. The method of claim 1, wherein the second feature and the third feature are significantly smaller than the first feature.

12. The method of claim 11, wherein the first feature, second feature, and third feature comprise dimensions of length, width, and thickness, and wherein the second feature and the third feature have a width significantly less than a width of the first feature.

13. The method of claim 12, wherein the width of the second feature and the third feature is not greater than approximately 90% of the width of the first feature.

14. The method of claim 12, wherein the length of the second feature and the third feature is substantially the same as the length of the first feature.

15. The method of claim 1, wherein selectively removing comprises:
   completing a first portion of a selective etching process using a first etchant; and
   completing a second portion of a selective etching process using a second etchant, the second etchant comprising an oxygen-containing material in a greater amount than present in the first etchant.

16. The method of claim 15, wherein the first etchant comprises a hydrogen-containing material, and the second etchant comprises significantly less hydrogen-containing materials than the first etchant.

17. The method of claim 16, wherein the first etchant comprises HBr, $CCl_4$, $CF_4$, $CHF_3$, or a combination thereof.

18. The method of claim 1, further comprising completely removing the first feature after selectively removing portions of the underlying layer.

19. A method of forming an electronic device comprising:
   forming a patterned resist layer overlying a polysilicon layer,
   the patterned resist layer having
      a first feature,
      a second feature, and
      a third feature, wherein the first feature is between the second feature and the third feature,
wherein the first feature
- is spaced apart from the second feature by a first opening in the resist layer and
- is spaced apart from the third feature by a second opening in the resist layer, wherein the first feature comprises an array of discrete patterned portions laterally spaced apart and separated from each other,
wherein each of the discrete patterned portions have a width (W2),
wherein the second feature comprises a width (W1), and
wherein the width of each of the discrete patterned portions (W2) is different than the width of the second feature (W1);
selectively etching all of the polysilicon layer under
- the first opening,
- the second opening,
- the second feature, and
- the third feature using a first etchant comprising a hydrogen-containing material; and completely removing the second feature and the third feature
using a second etchant comprising
- an oxygen-containing material and
- less hydrogen-containing material than the first etchant, wherein after selectively etching, the first feature remains and a significant portion of the polysilicon layer having a full thickness of the polysilicon layer underlying the first feature remains.

20. A method of forming an electronic device comprising:
forming a patterned mask layer
overlying an underlying layer and
having
a first feature,
a second feature, and
a third feature,
wherein the first feature is between the second feature and the third feature,
wherein the first feature
- is spaced apart from the second feature by a first opening in the mask layer and
- is spaced apart from the third feature by a second opening in the mask layer, wherein the first feature comprises an array of discrete patterned portions laterally spaced apart and separated from each other by openings in the mask layer,
wherein the lateral distance between each of the discrete patterned portions define a gap distance,
wherein the second feature is spaced apart from an immediately adjacent discrete patterned portion of the first feature by a first lateral distance, and
wherein the first lateral distance and the gap distance are different;
selectively removing portions of the underlying layer under
- the first opening,
- the second opening,
- the second feature, and
- the third feature; and removing, by etching, the second feature and the third feature while leaving substantially all of the first feature and a significant portion of the underlying layer under the first feature.

* * * * *